United States Patent
Kato

(10) Patent No.: US 10,716,028 B2
(45) Date of Patent: Jul. 14, 2020

(54) WIRELESS COMMUNICATION APPARATUS AND WIRELESS COMMUNICATION METHOD

(71) Applicant: Panasonic Intellectual Property Management Co., Ltd., Osaka (JP)

(72) Inventor: Osamu Kato, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 4 days.

(21) Appl. No.: 15/565,379

(22) PCT Filed: Feb. 25, 2016

(86) PCT No.: PCT/JP2016/001003
§ 371 (c)(1),
(2) Date: Oct. 9, 2017

(87) PCT Pub. No.: WO2016/185640
PCT Pub. Date: Nov. 24, 2016

(65) Prior Publication Data
US 2018/0077602 A1    Mar. 15, 2018

(30) Foreign Application Priority Data
May 15, 2015   (JP) .................. 2015-100011

(51) Int. Cl.
*H04L 12/801* (2013.01)
*H04L 12/24* (2006.01)
(Continued)

(52) U.S. Cl.
CPC ......... *H04W 28/04* (2013.01); *H03M 13/353* (2013.01); *H04L 1/00* (2013.01);
(Continued)

(58) Field of Classification Search
CPC ... H04L 1/0018; H04L 1/0009; H04L 1/0041; H04L 47/283; H04W 28/18; H04W 16/32
See application file for complete search history.

(56) References Cited

U.S. PATENT DOCUMENTS 7,453,793 B1 * 11/2008 Jones, IV ............ H04L 25/0216
370/203
9,078,280 B2    7/2015 Watanabe
(Continued)

FOREIGN PATENT DOCUMENTS

JP    2003-298560 A    10/2003
JP    2007-243346 A    9/2007
(Continued)

OTHER PUBLICATIONS

International Search Report, dated Apr. 19, 2016, corresponding to International Application No. PCT/JP2016/001003, 4 pages.
(Continued)

*Primary Examiner* — Brian S Roberts
*Assistant Examiner* — Abusayeed M Haque
(74) *Attorney, Agent, or Firm* — Seed IP Law Group LLP

(57) ABSTRACT

Provided is a wireless communication apparatus capable of improving communication quality and reducing a communication time delay in a case of communicating data over a backhaul line. The wireless communication apparatus is a wireless communication apparatus which communicates with another wireless communication apparatus over a wireless backhaul line in which a plurality of wireless communication schemes are mixed and used, and includes a processor that determines whether or not to add redundant data to data, in accordance with an allowable delay time of the data, and an antenna that transmits the data by adding or not adding the redundant data to the data, in accordance with a result of the determination.

12 Claims, 5 Drawing Sheets

(51) Int. Cl.
*H04L 5/14* (2006.01)
*H04L 12/44* (2006.01)
*H04L 12/28* (2006.01)
*H04W 28/04* (2009.01)
*H04W 92/20* (2009.01)
*H04L 1/00* (2006.01)
*H04W 28/18* (2009.01)
*H03M 13/35* (2006.01)
*H04W 28/02* (2009.01)
*H04W 16/32* (2009.01)
*H03M 13/00* (2006.01)
*H04L 12/841* (2013.01)
*H04W 72/08* (2009.01)

(52) U.S. Cl.
CPC .......... *H04L 1/0003* (2013.01); *H04L 1/0009* (2013.01); *H04L 1/0018* (2013.01); *H04L 1/0041* (2013.01); *H04W 28/18* (2013.01); *H04W 92/20* (2013.01); *H03M 13/6547* (2013.01); *H04L 47/283* (2013.01); *H04W 16/32* (2013.01); *H04W 28/0236* (2013.01); *H04W 72/08* (2013.01)

(56) References Cited

U.S. PATENT DOCUMENTS

| | | | |
|---|---|---|---|
| 9,686,006 B2 | 6/2017 | Watanabe | |
| 2008/0288986 A1* | 11/2008 | Foster | G08B 13/19656 725/62 |
| 2008/0304520 A1* | 12/2008 | Hannuksela | H04L 1/0057 370/498 |
| 2011/0096675 A1* | 4/2011 | Li | H04B 17/309 370/252 |
| 2012/0300694 A1 | 11/2012 | Watanabe | |
| 2013/0129005 A1* | 5/2013 | Xia | H04L 1/007 375/295 |
| 2014/0185496 A1 | 7/2014 | Wolf et al. | |
| 2014/0219230 A1 | 8/2014 | Schierl et al. | |
| 2014/0269767 A1* | 9/2014 | Djukic | H04L 1/1896 370/474 |
| 2014/0319210 A1* | 10/2014 | Angus | G07F 19/209 235/379 |
| 2015/0055541 A1* | 2/2015 | Zhang | H04W 72/005 370/312 |
| 2015/0229431 A1* | 8/2015 | Sugawa et al. | H04J 14/0257 398/72 |
| 2015/0270888 A1 | 9/2015 | Watanabe | |
| 2016/0007337 A1* | 1/2016 | Hessler | H04B 7/024 370/230 |

FOREIGN PATENT DOCUMENTS

| | | |
|---|---|---|
| JP | 2014-533003 A | 12/2014 |
| WO | 2011/077807 A1 | 6/2011 |

OTHER PUBLICATIONS

NTT DOCOMO, Inc. "DOCOMO 5G White Paper—5G Radio Access: Requirements, Concept and Technologies," Jul. 2014, 27 pages.

Seigo Nakao et al., "Activities on heterogeneous networks for 5G:—C-plane/U-plane Splitting Control in Heterogeneous Networks," *The Institute of Electronic, Information and Communication Engineers*, IEICE Technical Report, Oct. 2014, 8 pages. (With Partial English Translation).

Seiichi Sampei, "A Study on Technical Direction of Wireless Access and Netowrking for 5G Cellular Systems," *The Institute of Electronic, Information and Communication Engineers*, IEICE Technical Report, Oct. 2014, 8 pages. (With Partial English Translation).

* cited by examiner

WIRELESS COMMUNICATION APPARATUS AND WIRELESS COMMUNICATION METHOD

TECHNICAL FIELD

The present disclosure relates to a wireless communication apparatus and a wireless communication method.

BACKGROUND ART

A system has been known in which communication is performed using a priority control scheme when a terminal and a wireless base station communicate in a wireless manner. A wireless communication system that communicates using a priority control scheme that does not use carrier scanning and Inter Frame Space (IFS) is known as a wireless communication system in the related art (for example, see Patent Document 1).

The wireless communication system includes a wireless base station device and a plurality of wireless terminal station devices. The wireless base station device specifies the window size and retransmission function for each of the plurality of service classes and transmits the window size and the retransmission function to the wireless terminal station device. The wireless terminal station device calculates the transmission window size by using the window size of the service class to which the data packet to be transmitted belongs or both the window size and the retransmission function. The wireless terminal station device uses an arbitrary time within the range of the transmission window size as a backoff time, and transmits a data packet after the calculated backoff time elapses since a data packet to be transmitted is generated. In a case where the transmission of the data packet fails, the wireless terminal station device recalculates the transmission window size using the window size or both the window size and the retransmission function, and recalculates and retransmits the backoff time from the changed transmission window size. The wireless base station device measures the communication status for each service class and determines the window size or retransmission function for recalculating the backoff time according to the communication status.

In recent years, a heterogeneous network has been studied in a wireless communication system in which a terminal and a wireless base station are connected over a network (see, for example, NPLs 1 to 3).

CITATION LIST

Patent Literature

PTL 1: Japanese Patent Unexamined Publication No. 2007-243346

Non-Patent Literature

NPL 1: Seigo Nakao, Tetsuya Yamamoto, Shozo Okasaka, and Hidetoshi Suzuki, "Efforts on heterogeneous networks towards 5G-C-plane/U-plane separated heterogeneous network-", IEICE technical report, The Institute of Electronics, Information and Communication Engineers, October 2014, P 83-88

NPL 2: Seiichi Sampei, "A study on the direction of radio access network in fifth generation cellular system", IEICE technical report, The Institute of Electronics, Information and Communication Engineers, October 2014, P 153-P 158

NPL 3: "Docomo 5G white paper on requirements and technical concepts for 5G wireless access after 2020", NTT Docomo, September 2014, P 1-14

SUMMARY OF THE INVENTION

In the case where the technique described in Patent Document 1 is applied to communication in a plurality of wireless communication apparatuses connected through a backhaul line, it is difficult to improve communication quality for communicating data and reduce a communication time delay among the plurality of wireless communication apparatuses.

The present disclosure has been made in view of the above circumstances, and is to provide a wireless communication apparatus and a wireless communication method capable of improving the communication quality and reducing the communication delay time in a case of communicating data through a backhaul line.

A wireless communication apparatus of the present disclosure is a wireless communication apparatus which communicates with another wireless communication apparatus over a wireless backhaul line in which a plurality of wireless communication schemes are mixed and used, and includes a processor that determines whether or not to add redundant data to data, in accordance with an allowable delay time of the data, and an antenna that transmits the data by adding or not adding the redundant data to the data, in accordance with a result of the determination.

According to the present disclosure, it is possible to improve communication quality and reduce a communication time delay in a case of communicating data over a backhaul line.

DESCRIPTION OF EMBODIMENT

Hereinafter, exemplary embodiments will be described in detail with reference to the drawings as appropriate. However, a detailed description more than necessary may be omitted in some cases. For example, detailed descriptions of already well-known matters and duplicate descriptions for substantially the same components may be omitted in some cases. This is to facilitate the understanding of those skilled in the art, by avoiding the following description from being unnecessarily redundant. In addition, the accompanying drawings and the following description are provided in order to help those skilled in the art fully understand the present disclosure, and are not intended to limit the subject described in claims.

(Background to the Achievement of One Aspect of the Present Disclosure)

In fifth generation mobile communication (5G), a wireless communication system is configured to include a macrocell base station and a small cell base station. Then, a heterogeneous network is formed in which wireless base stations having various wireless standards and cell radii are mixed.

It is expected that efficient installation of the backhaul line becomes important when the installation surface density of the small cell base station becomes high. The backhaul line includes, for example, a line between a small cell base station and a macrocell base station, or a line between a small cell base station and a backbone network. From the viewpoint of stability of communication quality of the backhaul line, an optical line is effective as the backhaul line. On the other hand, from the viewpoint of the economy and rapidity of the installation of the backhaul line, a wireless line is effective as the backhaul line.

In a case where a wireless backhaul line is used as the backhaul line, the packet quality is poor compared with the case where the optical line is used, so the packet error rate (PER) increases.

On the other hand, in order to improve the transmission quality, error correction coding (for example, Forward Error Correction (FEC)) is effective. However, when FEC is used, it takes time to perform a process related to FEC, and communication delay is likely to occur. If the FEC code length and the interleave size are increased in order to improve the performance of FEC coding, the communication delay further increases.

Hereinafter, a wireless communication apparatus and a wireless communication method capable of improving the communication quality and reducing the communication delay time in a case of communicating data through a backhaul line will be described.

First Exemplary Embodiment

[Configuration and Others]

Figure 1:
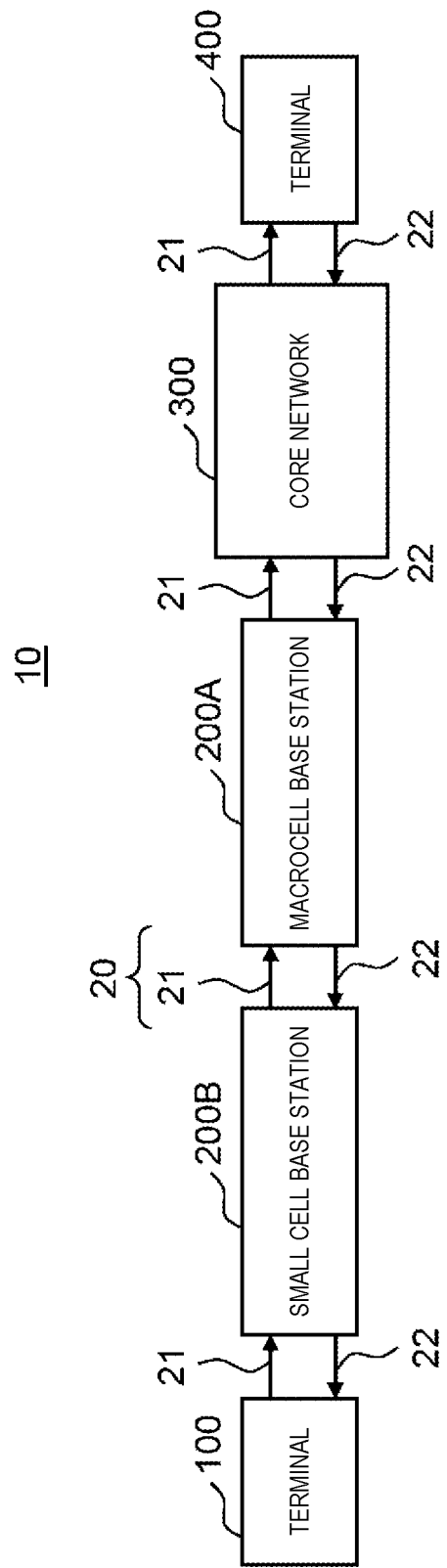
FIG. 1 is a schematic diagram showing a configuration example of a wireless communication system in a first exemplary embodiment.

FIG. 1 is a block diagram showing a configuration example of wireless communication system 10 in a first exemplary embodiment. Wireless communication system 10 includes terminals 100, 400, plural base stations 200, and core network 300. Plural base stations 200 are connected over wireless backhaul line 20. Plural small cell base stations 200B communicate with macrocell base station 200A over wireless backhaul line 20.

Wireless communication system 10 is a heterogeneous network in which base stations 200 have various wireless standards. Base stations 200 can also communicate with terminal 100. In the heterogeneous network, base stations 200 of different wireless communication schemes (for example, Radio Access Technology (RAT)) or having different cell radii are mixed. In the heterogeneous network, for example, plural types of radio standards are mixed, and base stations 200 with different cell radii are mixed geographically. The RAT includes, for example, wireless communication standards, and information on radio frequencies.

This heterogeneous network may not be a C/U separation type network, or may be the C/U separation type network. That is, in wireless communication system 10, the communication related to the control data and the communication related to the user data may be performed by the same base station 200, or may be performed by different base stations 200. The user data is transmitted between macrocell base station 200A and small cell base stations 200B over wireless backhaul line 20 in a case where terminals 100 are connected to small cell base stations 200B in user plane.

Base station 200 includes macrocell base station 200A and small cell base station 200B. Terminal 100 communicates control data and user data with macrocell base station 200A and small cell base station 200B. The control data includes data relating to Control (C)-Plane. The user data includes data relating to User (U)-Plane. The user data includes, for example, image data (for example, moving image and still image) and audio data, and can include data having a large volume.

The C-plane is a communication protocol for communicating the control data for call connection or radio resource allocation in wireless communication. The U-plane is a communication protocol for actually performing communication (for example, video communication, audio communication, and data communication) using the allocated radio resources.

The cell radius of macrocell base station 200A is, for example, 1 km to several km, which is relatively large. For example, one type (for example, LTE) or a plurality of types of RATs that can be adopted by macrocell base station 200A may be used. The cell radius corresponds to the maximum transmission distance of base station 200.

The cell radius of small cell base station 200B is, for example, 10 m to 100 m, which is relatively small. The RATs that can be adopted by small cell base station 200B are diverse, and there are multiple types of RATs. For example, the cell radius may be 100 m or more in the mountains, the desert area, and the forest area, or may be larger than the cell radius of macrocell base station 200A. That is, here, the distinction between macrocell base station 200A and small cell base station 200B may be performed regardless of the size of the cell radius. The communicable coverage area of base station 200 is determined, for example, according to the position and the cell radius of base station 200.

Base station 200 sets a RAT to be used for communication, from among the RATs (for example, the wireless communication standard and the radio frequency) that can be adopted by base station 200, and performs wireless communication according to the set RAT. Base station 200 can adopt one or more RATs.

The wireless communication standard includes, for example, Long Term Evolution (LTE), Wireless Local Area Network (LAN), Digital Enhanced Cordless Telecommunication (DECT), 3rd generation mobile communication system (3G), fourth generation mobile communication system (4G), fifth generation mobile communication system (5G).

Specific information of RAT includes, for example, the following RAT 1 to RAT 5. RAT 1 is, for example, LTE with a radio frequency band of 700 MHz to 3 GHz. RAT 2 is, for example, LTE-Advanced with a radio frequency band of 15 GHz. RAT 3 is, for example, wireless LAN communication with a radio frequency band of 5 GHz. RAT 4 is, for example, a wireless communication scheme with a radio frequency band of 15 GHz band, and is a fifth generation mobile communication system. RAT 5 is, for example, a wireless communication scheme (for example, millimeter-wave communication) (for example, WiGig) with a radio frequency band of 60 GHz band.

Terminal 100 is, for example, a terminal of a first user (own terminal), and terminal 400 is, for example, a terminal of a second user (terminal of a communication partner). In core network 300, base station 200 (for example, macrocell base station 200A) and terminal 400 are connected. In a case where terminal 100 and terminal 400 communicate with each other, for example, data is transmitted through small cell base station 200B, macrocell base station 200A, and core network 300.

Another base station 200 may be provided between core network 300 and terminal 400. Core network 300 may include the Internet and private lines.

Figure 2:
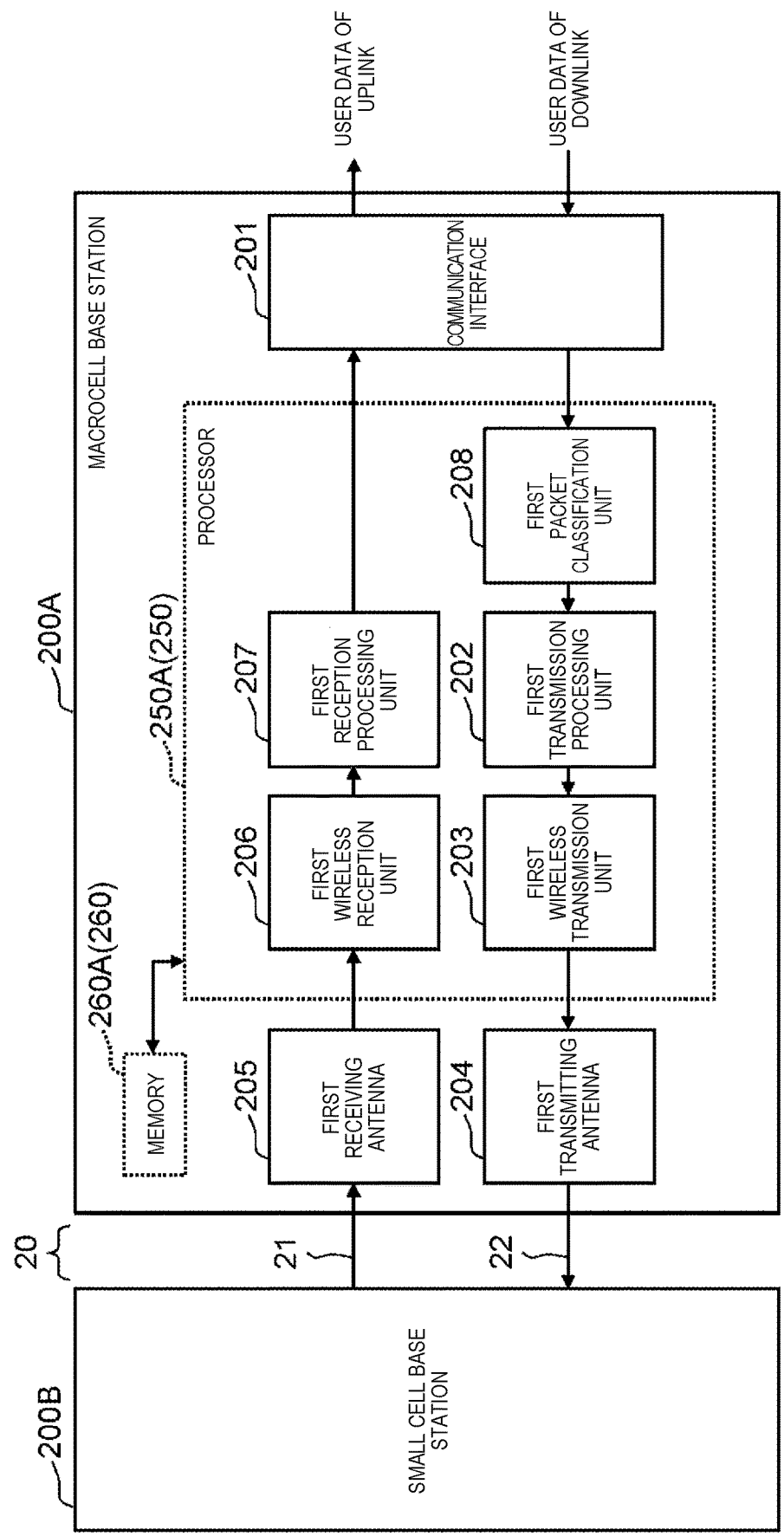
FIG. 2 is a block diagram showing a configuration example of a macrocell base station in the first exemplary embodiment.

FIG. 2 is a block diagram showing a configuration example of macrocell base station 200A.

Macrocell base station 200A and small cell base station 200B are connected over wireless backhaul line 20. Wireless backhaul line 20 includes uplink 21 and downlink 22. Uplink 21 is a wireless line heading from small cell base station 200B to macrocell base station 200A in wireless backhaul line 20. Downlink 22 is a wireless line heading from macrocell base station 200A to small cell base station 200B in wireless backhaul line 20. Wireless lines broadly include various public lines, mobile phone lines, wide area wireless lines, and the like.

Macrocell base station 200A has one or plural small cell base stations 200B existing around macrocell base station 200A as communication partners. Small cell base station 200B has one macrocell base station 200A as a communication partner. Since macrocell base station 200A and small cell base station 200B are fixedly installed, the communication partners of macrocell base station 200A and small cell base station 200B are determined in advance.

Macrocell base station 200A includes processor 250A, memory 260A, communication interface 201, first transmitting antenna 204, and first receiving antenna 205.

Processor 250A cooperates with memory 260A to perform various processes and controls. Specifically, processor 250A implements the function of each of the following units by executing the program retained in memory 260A. Each unit includes first packet classification unit 208, first transmission processing unit 202, first wireless transmission unit 203, first wireless reception unit 206, and first reception processing unit 207.

Memory 260A stores, for example, various data, information, and programs. Memory 260A may be built into processor 250A. Memory 260A may include a secondary storage device as well as a primary storage device. The temporary storage device includes, for example, a Random Access Memory (RAM) and a Read Only Memory (ROM). The secondary storage device includes, for example, a Hard Disk Memory (HDD) and a Solid State Drive (SSD). Memory 260A retains, for example, position information (for example, longitude and latitude) of each small cell base station 200B.

Communication interface 201 is a communication interface for connecting macrocell base station 200A and core network 300. A higher-level device is connected to core network 300. Examples of the higher-level device include a Serving Gateway (SGW) in a case where the RAT is LTE, a Serving General packet radio service support node (SGSN) in a case where the RAT is Wideband Code Division Multiple Access (W-CDMA).

For example, communication interface 201 transmits data of uplink 21 (control data or user data) through core network 300, and receives data of downlink 22 (control data or user data) through core network 300.

First packet classification unit 208 generates a packet (first transmission packet) to be transmitted to small cell base station 200B. The first transmission packet includes the data of downlink 22. The data of downlink 22 (control data or user data) is achieved from, for example, from terminal 400 through core network 300. The data of downlink 22 may be obtained from memory 260A, an external device (not shown) such as a storage device and a display device, and a processing unit (not shown) of various types of software.

First packet classification unit 208 classifies the first transmission packet, based on the allowable delay time of the first transmission packet. The allowable delay time is the time allowed as the time required for data transmission in the communication between macrocell base station 200A and small cell base station 200B. For example, first packet classification unit 208 classifies the first transmission packet into a packet in which the allowable delay time is shorter than predetermined time t1 (hereinafter also referred to as "packet A") and a packet in which the allowable delay time is equal to or longer than predetermined time t1 (hereinafter also referred to as "packet B").

Predetermined time t1 is, for example, 1 milliseconds (ms). Since predetermined time t1 is 1 ms, it is possible to satisfy, for example, the requirement of the communication delay time in remote control for a vehicle (such as brake control), electronic commerce that conflicts on time (such securities transaction), and in the online game.

First transmission processing unit 202 determines whether to perform FEC coding, based on the allowable delay time of the first transmission packet. In the case of FEC coding, a redundant packet is added to the first transmission packet. First transmission processing unit 202 may perform FEC coding, based on an FEC coding method described later.

In FEC coding, macrocell base station 200A has a longer communication delay time, but communication quality can be improved. Therefore, in a case where the first transmission packet is a TCP packet, macrocell base station 200A can reduce the error rate of the TCP layer packet between terminal 100 and terminal 400, and shorten the time required for retransmission of the first transmission packet.

In the case where FEC coding is not performed, it is difficult for macrocell base station 200A to ensure communication quality, but since time required for FEC coding can be omitted, communication delay can be shortened and a possibility of satisfying the requirement of the allowable delay time can be increased.

First transmission processing unit 202 performs a transmission process on the first transmission packet, according to the wireless transmission scheme for transmitting the packet A or the packet B. The transmission process includes, for example, a coding process, a modulation process, a transmission power control process, and a retransmission control process. The details of the wireless transmission scheme will be described later.

In a case where the amount of radio resources (radio resource amount) of wireless backhaul line 20 (here, downlink 22) is less than the packet amount of the first transmission packet, first transmission processing unit 202 has insufficient radio resources of downlink 22 for the packet amount. Therefore, first transmission processing unit 202 preferentially allocates radio resources to packet A.

Examples of the radio resources include radio frequencies used for communication, and a part of the radio frequencies (a part of the frequency axis, a part of the time axis, or a combination thereof). A part of the frequency axis indicates, for example, a subcarrier frequency or a bundle of a plurality of subcarrier frequencies. A part of the time axis indicates, for example, a time slot or a bundle of a plurality of time slots.

First wireless transmission unit 203 acquires the first transmission packet obtained by first transmission processing unit 202. First wireless transmission unit 203 transmits the first transmission packet to small cell base station 200B through downlink 22 and first transmitting antenna 204.

First transmitting antenna 204 includes, for example, a plurality of Multiple-Input and Multiple-Output (MIMO) antennas. The plurality of MIMO antennas may be provided physically or logically.

First wireless reception unit 206 receives the packet (second received packet) from small cell base station 200B through uplink 21 and first receiving antenna 205.

First reception processing unit 207 performs a reception process on the second received packet. The reception process includes, for example, a decoding process, a demodulation process, and a retransmission control process. First reception processing unit 207 may perform the reception process, based on the wireless transmission scheme adopted by small cell base station 200B or a wireless transmission scheme corresponding to this scheme.

First reception processing unit 207 decodes the second received packet to obtain second decoded data. The second decoded data includes the data of uplink 21. For example, the data of uplink 21 (control data or user data) is transmitted to small cell base station 200B through core network 300. The data of uplink 21 is transferred to memory 260A, an external device (not shown) such as a storage device and a display device, and a processing unit (not shown) of various types of software.

Figure 3:
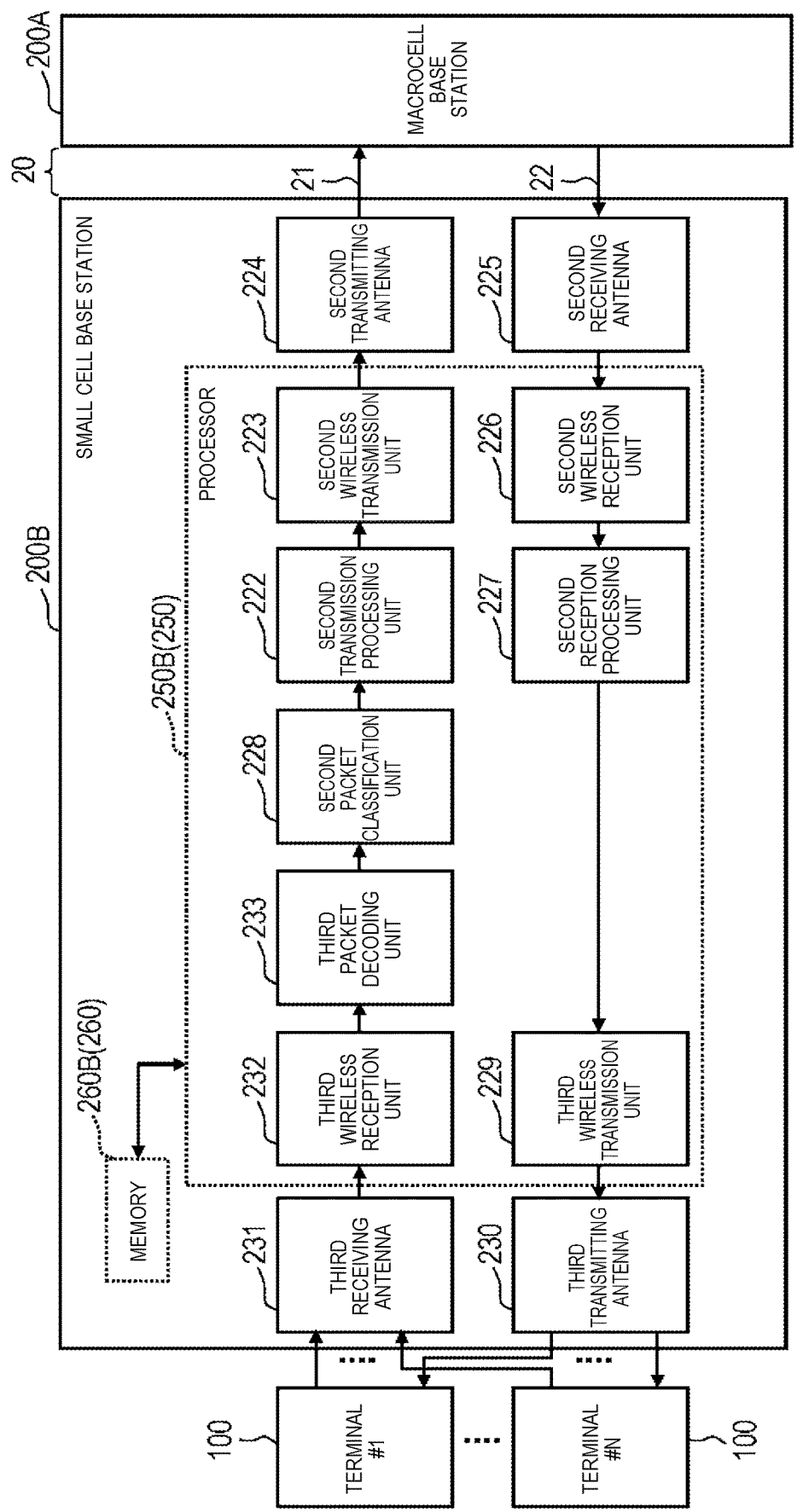
FIG. 3 is a block diagram showing a configuration example of a small cell base station in the first exemplary embodiment.

FIG. 3 is a block diagram showing a configuration example of small cell base station 200B.

Small cell base station 200B includes processor 250B, memory 260B, second transmitting antenna 224, second receiving antenna 225, third transmitting antenna 230, and third receiving antenna 231.

Processor 250B cooperates with memory 260B to perform various processes and controls. Specifically, processor 250B implements the function of each of the following units by executing the program retained in memory 260B. Each unit includes second transmission processing unit 222, second wireless transmission unit 223, second wireless reception unit 226, second reception processing unit 227, second packet classification unit 228, third wireless transmission unit 229, third wireless reception unit 232, and third packet decoding unit 233.

Memory 260B stores, for example, various data, information, and programs. Memory 260B may be built into processor 250B. Memory 260B may include a secondary storage device as well as a primary storage device. Memory 260B retains, for example, position information (for example, longitude and latitude) of macrocell base station 200A.

Third wireless reception unit 232 receives, for example, a packet (third received packet) from terminal 100 under small cell base station 200B using third receiving antenna 231 through a Radio Access Network (RAN).

Third packet decoding unit 233 performs a reception process on the third received packet. For example, third packet decoding unit 233 decodes the third received packet to obtain third decoded data. The third decoded data includes data (control data or user data) from terminal 100.

Second packet classification unit 228 generates a packet (second transmission packet) to be transmitted to macrocell base station 200A. The second transmission packet includes the data of uplink 21. The data of uplink 21 includes, for example, data from terminal 100. The data (control data and user data) of uplink 21 is obtained from, for example, third packet decoding unit 233, memory 260B, an external device (not shown) such as a storage device and a display device, and a processing unit (not shown) of various types of software.

Second packet classification unit 228 classifies the second transmission packet, based on the allowable delay time of the second transmission packet.

Second transmission processing unit 222 determines whether to perform FEC coding, based on the allowable delay time of the second transmission packet. In the case of FEC coding, a redundant packet is added to the second transmission packet. Second transmission processing unit 222 may perform FEC coding, based on the code length and the number of interleaves.

In FEC coding, small cell base station 200B has a longer communication delay time, but communication quality can be improved. Therefore, in a case where the second transmission packet is a TCP packet, small cell base station 200B can reduce the error rate of the TCP layer packet between terminal 100 and terminal 400, and shorten the time required for retransmission of the second transmission packet.

In the case where FEC coding is not performed, it is difficult for small cell base station 200B to ensure communication quality, but since time required for FEC coding can be omitted, communication delay can be shortened and a possibility of satisfying the requirement of the allowable delay time can be increased.

Second transmission processing unit 222 performs a transmission process on the second transmission packet, according to the wireless transmission scheme for transmitting the packet A or the packet B. The transmission process includes, for example, a coding process, a modulation process, a transmission power control process, and a retransmission control process.

In a case where the radio resource amount of wireless backhaul line 20 (here, uplink 21) is less than the packet amount of the second transmission packet, second transmission processing unit 222 has insufficient radio resources of uplink 21 for the packet amount. Therefore, second transmission processing unit 222 preferentially allocates radio resources to packet A.

Second wireless transmission unit 223 acquires the second transmission packet obtained by second transmission processing unit 222. Second wireless transmission unit 223 transmits the second transmission packet to macrocell base station 200A through uplink 21 and second transmitting antenna 224.

Second transmitting antenna 224 includes, for example, a plurality of MIMO antennas. The plurality of MIMO antennas may be provided physically or logically.

Second wireless reception unit 226 receives the packet (first received packet) from macrocell base station 200A through downlink 22 and second receiving antenna 225.

Second reception processing unit 227 performs a reception process on the first received packet. The reception process includes, for example, a decoding process, a demodulation process, and a retransmission control process. Second reception processing unit 227 may perform the reception process, based on the wireless transmission scheme adopted by macrocell base station 200A or a wireless transmission scheme corresponding to this scheme.

Second reception processing unit 227 decodes the first received packet to obtain first decoded data. The first decoded data includes the data of downlink 22. The data of downlink 22 (control data or user data) is transmitted to, for example, terminal 100. The data of downlink 22 is transferred to third wireless transmission unit 229, memory 260A, an external device (not shown) such as a storage device and a display device, and a processing unit (not shown) of various types of software.

Third wireless transmission unit 229 acquires the first received packet obtained by second reception processing unit 227. Third wireless transmission unit 229 transmits the third transmission packet to terminal 100, through third transmitting antenna 230 and RAN. The third transmission packet includes, for example, data of downlink 22 from second reception processing unit 227.

[Details of Wireless Transmission Scheme]

Next, details of the wireless transmission scheme adopted by base station 200 will be described.

The wireless transmission scheme includes, for example, a multi-level modulation scheme, an MIMO transmission scheme, an FEC coding scheme, and an automatic repeat-request (ARQ) scheme. For the multi-level modulation scheme, an adaptive modulation scheme determined in consideration of the line condition of wireless backhaul line 20 may be used.

In the multi-level modulation scheme, for example, the modulation multi-level count (constellation size) related to the multi-level modulation is determined. The higher the multi-level modulation number, the higher the communication speed (faster) and the shorter the communication delay time, but the communication quality (for example, Bit Error Rate (BER) and Packet Error Rate (PER)) deteriorates. The smaller the multi-level modulation number, the lower the communication speed (slower) and the longer the communication delay time, but the communication quality is improved.

First transmission processing unit 202 or second transmission processing unit 222 performs multi-level modulation on the transmission packet, based on the determined multi-level modulation scheme (modulation multi-level count). Examples of the multi-level modulation include Quadrature Phase Shift Keying (QPSK), 16 Quadrature Amplitude Modulation (QAM), and 64 QAM. The multi-level modulation is an example of the transmission process.

In the MIMO transmission scheme, for example, the number of MIMO transmission streams, the presence or absence of directivity (beamforming), and the magnitude of transmission power are determined. The number of streams corresponds to the number of independent paths. The magnitude of the transmission power corresponds to the magnitude of the power to be supplied to each MIMO antenna. The larger the number of MIMO transmission streams, the higher the communication speed, and the shorter the communication delay time. The smaller the number of streams, the lower the communication speed and the longer the communication delay time. If beamforming is used, communication quality is improved. When the same data is allocated to each MIMO antenna, the communication quality is improved, the communication speed is lowered, and the communication delay time is prolonged. If different data is allocated to each MIMO antenna, the communication quality deteriorates, the communication speed is increased, and the communication delay time is shortened. The higher the transmission power or the reception power, the better the communication quality of base station 200 of the transmission source.

First transmission processing unit 202 or second transmission processing unit 222 controls the power to be supplied to each antenna by allocating data to each MIMO antenna, based on the determined MIMO transmission scheme, for example, according to the number of MIMO streams. The allocation of data to each antenna and the control of the power to be supplied are an example of the transmission process. Data allocation and transmission power weighting to each antenna of the MIMO transmission scheme may be based on the RAT that can be employed by macrocell base station 200A and small cell base station 200B.

In the FEC coding scheme, for example, the code length of the FEC code and the number of interleaves are determined. The longer the code length of the FEC code or the larger the number of or interleaves, the longer the time required for FEC coding or FEC decoding, the longer the communication delay time, and the higher the communication quality. The shorter the code length of the FEC code or the smaller the number of interleaves, the shorter the time required for FEC coding or FEC decoding and the shorter the communication delay time, and the poorer the communication quality.

First transmission processing unit 202 or second transmission processing unit 222 generates an information packet including control data and user data, and a redundant packet, based on the determined FEC coding scheme, for example, based on the code length of the FEC code and the number of interleaves. The generation of the redundant packet and the information packet is an example of the transmission process.

In the automatic retransmission request scheme, for example, the presence or absence of a retransmission request, the allowable number of retransmissions in the case of requesting retransmission, and the allowable retransmission time are determined. The longer the allowable number of retransmissions or the longer the allowable retransmission time, the longer the communication delay time, and the better the communication quality. The smaller the allowable number of retransmissions or the shorter the allowable retransmission time, the longer the communication delay time, and the poorer the communication quality.

First transmission processing unit 202 or second transmission processing unit 222 determines whether or not retransmission for a received packet is necessary based on the determined automatic retransmission control scheme, and generates a retransmission request in a case where retransmission is necessary. The retransmission request is transmitted by first wireless transmission unit 203. The determination on whether retransmission is necessary or not is an example of the transmission process.

First transmission processing unit 202 or second transmission processing unit 222 may select, for example, at least above-described one scheme for shortening the communication delay time for the packet A, and perform the transmission process. Thus, it is possible to further improve the communication delay time, in accordance with the non-implementation of the FEC coding.

First transmission processing unit 202 or second transmission processing unit 222 may select, for example, at least above-described one scheme for improving the communication quality for the packet A, and perform the transmission process. Thus, it is possible to further improve the communication quality even if the FEC coding is not performed.

First transmission processing unit 202 or second transmission processing unit 222 may select, for example, at least above-described one scheme for improving the communication quality for the packet B, and perform the transmission process. Thus, it is possible to further improve the communication quality, in accordance with the implementation of the FEC coding.

First transmission processing unit 202 or second transmission processing unit 222 may select, for example, at least above-described one scheme for shortening the communication delay time for the packet B, and perform the transmission process. Thus, it is possible to further improve the communication delay time even if the FEC coding is performed.

[Operation and Others]

Next, an operation example of wireless communication system 10 will be described.

Figure 4:
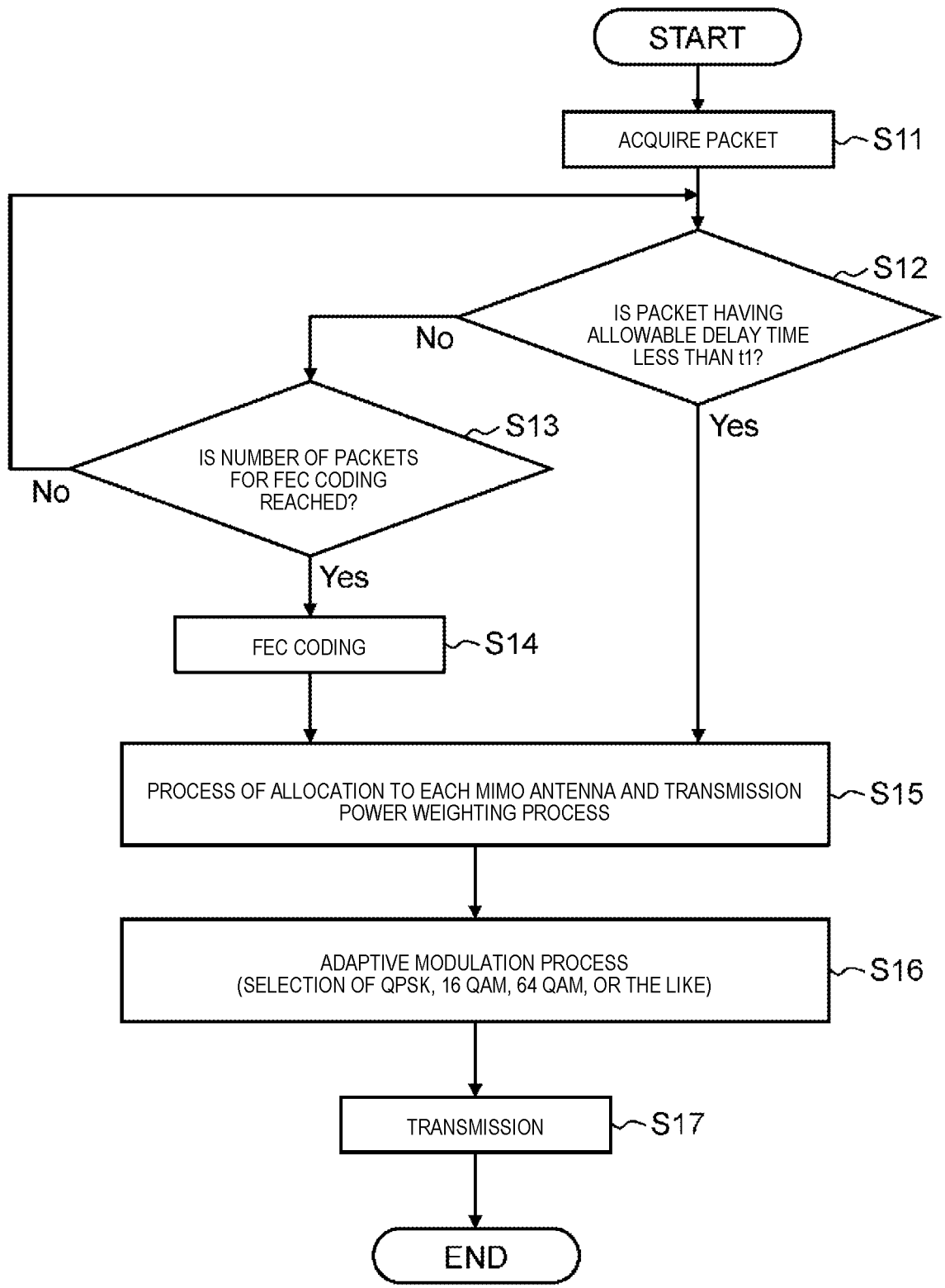
FIG. 4 is a sequence diagram showing a first operation example when base stations perform communication over a wireless backhaul line.

FIG. 4 is a sequence diagram illustrating a first operation example by base station 200. FIG. 4 illustrates a case where base station 200 is macrocell base station 200A, but the same applies to the case where base station 200 is small cell base station 200B. In FIG. 4, an arbitrary scheme is used as each scheme of the wireless transmission scheme (MIMO transmission scheme, multi-level modulation scheme, or the like)

The first transmission packets that are to be transmitted are sequentially stored in memory 260A until they are transmitted.

First, first transmission processing unit 202 acquires a first transmission packet from first packet classification unit 208 (S11).

First transmission processing unit 202 determines whether or not the acquired allowable delay time of the first transmission packet is shorter than predetermined time t1 (S12). In other words, first transmission processing unit 202 determines whether the first transmission packet is the packet A or the packet B. For example, the information on the allowable delay time is included in "Type of Service" included in the header of the first transmission packet.

In a case where the allowable delay time is equal to or greater than predetermined time t1, first transmission processing unit 202 determines whether or not the required number of packets for FEC coding is acquired, based on the FEC coding scheme (S13). In this case, since the packets required for FEC coding are retained in, for example, memory 260A, first transmission processing unit 202 refers to memory 260A. In a case where the required number of packets for FEC coding are not retained in memory 260A, first transmission processing unit 202 accumulates the obtained first transmission packets in memory 260A.

In a case where the required number of packets for FEC coding are acquired, first transmission processing unit 202 performs FEC coding on the required number of packets for FEC coding (S14). That is, first transmission processing unit 202 adds a redundant packet to the first transmission packet.

First transmission processing unit 202 performs the transmission process based on an arbitrary wireless transmission scheme. For example, first transmission processing unit 202 allocates data to each MIMO antenna and determines the ratio of the power to be supplied to each antenna (transmission power weighting) based on an arbitrary MIMO transmission scheme so as to determine the power to be supplied to each antenna (MIMO transmission process) (S15). First transmission processing unit 202 performs adaptive modulation (for example, QPSK, 16 QAM, and 64 QAM) based on an arbitrary adaptive modulation scheme (adaptive modulation process) (S16). Multi-level modulation may be merely performed, instead of adaptive modulation. The processes of S15 and S16 may be integrated.

First wireless transmission unit 203 transmits the first transmission packet obtained by first transmission processing unit 202, to small cell base station 200B, through first transmitting antenna 204 and wireless backhaul line 20 (S17).

For adaptive modulation process, macrocell base station 200A may recognize the line status of wireless backhaul line 20 (here, downlink 22). For example, first wireless reception unit 206 receives the information on the line status, from small cell base station 200B which is a communication partner (feedback of the line status). First transmission processing unit 202 receives the information on the line status from first wireless reception unit 206, and performs an applicable modulation process depending on the line status.

In a case where the communication scheme is Time Division Duplex (TDD), the same radio frequency is used for uplink 21 and downlink 22. Therefore, macrocell base station 200 A may recognize the line status of uplink 21, and the feedback of the line status related to downlink 22 is unnecessary.

In a case where the communication scheme is Frequency Division Duplex (FDD), different radio frequencies are used for uplink 21 and downlink 22. Therefore, macrocell base station 200A needs to feed back the line status related to downlink 22 so as to recognize the line status of downlink 22.

Examples of the information on the line status include information on received power (for example, reception ranks 1 to 5), an adaptable wireless transmission scheme (for example, information for adaptability if 16 QAM is the multi-level modulation scheme), and information that can specify other line statuses.

In this way, macrocell base station 200A does not perform FEC coding on a packet group (packet A) having a relatively short allowable delay time, and performs FEC coding on a packet group (packet B) having a relatively long allowable delay time. Therefore, macrocell base station 200A can satisfy the requirement of allowable delay time while suppressing reduction of the line capacity of wireless backhaul line 20.

That is, in a case where the allowable delay time of the packet to be transmitted is relatively short, in other words, in a case where real-time property is required, macrocell base station 200A can shorten the delay time related to packet communication by giving priority to the communication delay time over the communication quality. In a case where the allowable delay time of the packet to be transmitted is relatively long, in other words, in a case where real-time property is not required, macrocell base station 200A can improve the BER and PER related to packet communication by giving priority to the communication quality over the communication delay time.

With respect to packets having a relatively long allowable delay time, it is considered that TCP is often used for the protocol of the transport layer of the OSI reference model. In a case where a packet error occurs in packet communication, the packet is retransmitted at the TCP layer. Therefore, macrocell base station 200A reduces the deterioration in communication quality in wireless backhaul line 20 using FEC, thereby reducing the retransmission rate at the TCP layer and increasing the throughput of wireless backhaul line 20.

In a case where small cell base station 200B performs the process of FIG. 4, second transmission processing unit 222 is used instead of first transmission processing unit 202, and second packet classification unit 228 is used instead of first packet classification unit 208. The second transmission packet is used instead of the first transmission packet, and memory 260B is used instead of memory 260A. Second wireless transmission unit 223 is used instead of first wireless transmission unit 203, and second transmitting antenna 224 is used instead of first transmitting antenna 204. The destination of the packet is macrocell base station 200A rather than small cell base station 200B.

Figure 5:
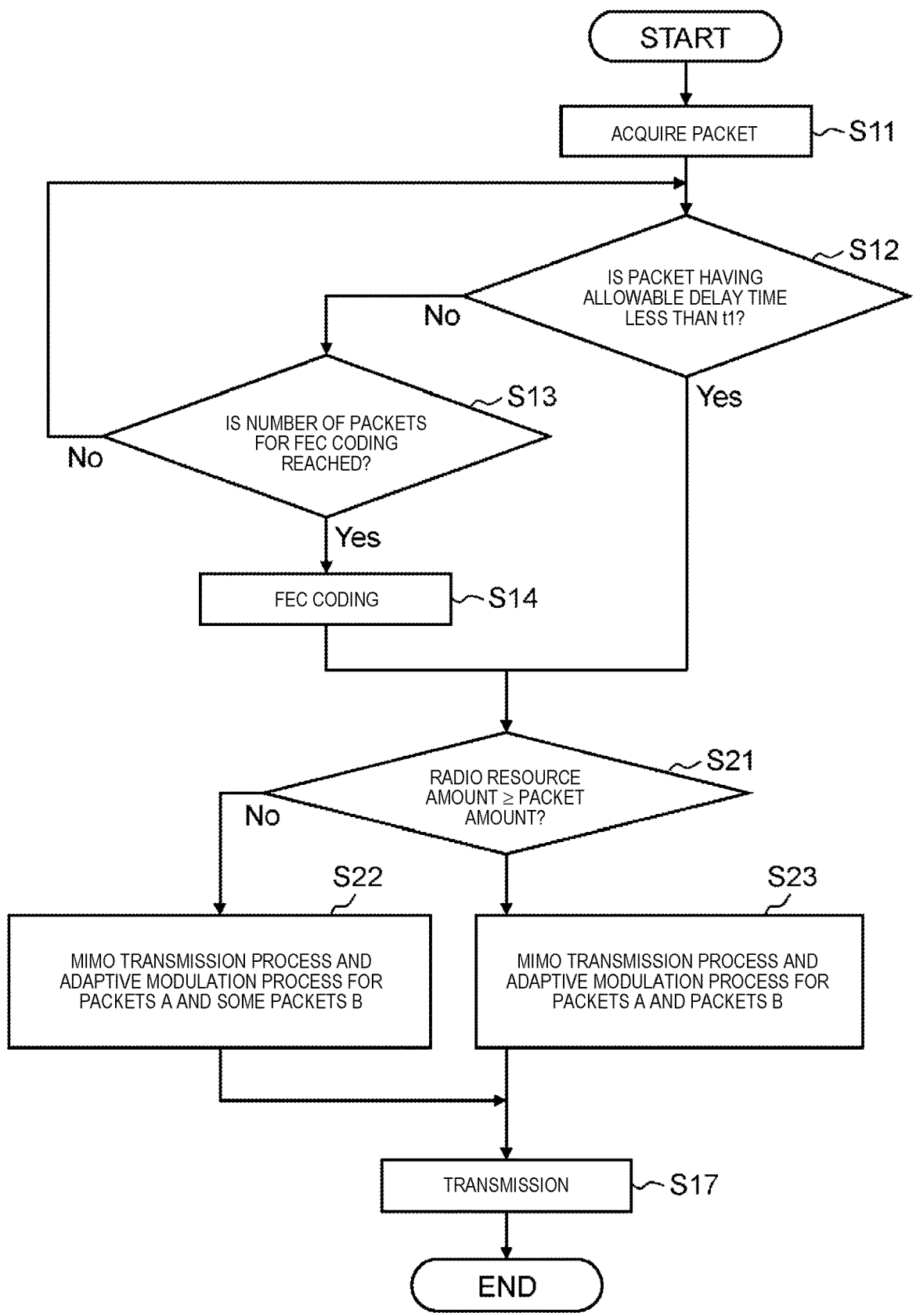
FIG. 5 is a sequence diagram showing a second operation example when the base stations perform communication over a wireless backhaul line.

FIG. 5 is a sequence diagram illustrating a second operation example by base station 200. FIG. 5 illustrates a case where base station 200 is macrocell base station 200A, but the same applies to the case where base station 200 is small cell base station 200B. In FIG. 5, processes similar to those in FIG. 4 are denoted by the same reference numerals, and descriptions thereof are omitted or simplified. In FIG. 5, an arbitrary scheme is used as each scheme of the wireless transmission scheme (MIMO transmission scheme, multi-level modulation scheme, or the like)

First, macrocell base station 200A performs the processes of S11 to S14.

In a case where the allowable delay time is shorter than predetermined time t1 in S12, or after FEC coding is performed in S14, first transmission processing unit 202 determines whether or not the allocable radio resource amount in wireless backhaul line 20 (here, downlink 22) is equal to or larger than the packet amount of the first transmission packet (S21).

In a case where the allocable radio resource amount is less than the packet amount of the first transmission packet, first transmission processing unit 202 allocates radio resources to the packet A and some packets B among the first transmission packets to be transmitted which are retained in memory 260A. The transmission process is performed based on an arbitrary wireless transmission scheme (S22). The total amount of the packet amounts of the packet A and some packets B is not more than the allocable radio resource amount. Examples of the transmission process include an MIMO transmission process and an adaptive modulation process, similarly to the first exemplary embodiment.

In S22, another part (remaining packets B) to which the radio resources are not allocated, among the packets B stored in memory 260A, is to be transmitted next time, and is subsequently retained in memory 260A.

In S21, in a case where the allocable radio resource amount is not more than the packet amount of the first transmission packet, radio resources are allocated to the first transmission packets (the packet A and packet B) to be transmitted which are retained in memory 260A. First transmission processing unit 202 performs the transmission process based on an arbitrary wireless transmission scheme (S23). In S23, since the amount of radio resources is sufficient, the packet B having a relatively long allowable delay time is also to be transmitted this time. Examples of the transmission process include an MIMO transmission process and an adaptive modulation process, similarly to the first exemplary embodiment.

After the process of S23, macrocell base station 200A performs the process of S17.

In this way, even in a case where the line capacity of wireless backhaul line 20 is insufficient for the amount of packets to be transmitted, macrocell base station 200A can increase a possibility of satisfying the request related to the communication delay time of a packet group (packet A) having a relatively short allowable delay time.

That is, even if the line capacity of wireless backhaul line 20 is insufficient, macrocell base station 200A preferentially allocates the radio resources to the packet A, thereby quickly starting the packet transmission and shortening the communication delay time. Macrocell base station 200A can allocate radio resources as much as possible to the packet B according to the line capacity of wireless backhaul line 20, thereby shortening the communication delay time.

[Effects and the Like]

As described above, base station 200 performs classification according to the allowable delay time, in view of the fact that the allowable delay time of packets communicated over wireless backhaul line 20 varies. For example, the base station 200 performs communication by classifying packets into packets A having a relatively short allowable delay time and packets B having a relatively long allowable delay time.

Since base station 200 does not perform FEC coding when transmitting the packets A, the time required for FEC coding and FEC decoding can be omitted and the communication delay time can be shortened. Base station 200 can improve the communication quality related to the packet communication, by performing FEC coding, when transmitting the packets B.

Base station 200 can further shorten the communication delay time by performing FEC coding when transmitting the packets A and selecting a wireless transmission scheme which gives priority to the communication delay time over the communication quality. Base station 200 can increase the communication quality and improve the communication delay time, by selecting a wireless transmission scheme which gives priority to the communication delay time over the communication quality, without performing FEC coding when transmitting the packets B.

Base station 200 can shorten the communication delay time and improve the communication quality by performing FEC coding when transmitting the packets A and selecting a wireless transmission scheme which gives priority to the communication quality over the communication delay time. It is possible to further enhance the communication quality by not performing FEC coding when transmitting the packets B and selecting a wireless transmission scheme which gives priority to the communication quality over the communication delay time.

Therefore, even in a case where wireless backhaul line 20 is used, in a case where the communication delay time is allowed, base station 200 performs FEC coding, thereby suppressing further deterioration in communication quality than the optical line and an increase in the BER and PER. Since FEC coding is performed in a case where the communication delay time is allowed, even in a case where the code length of the FEC code is long and the number of interleaves is large, base station 200 allows communication delay related to packet transmission so as to be able to improve the communication quality.

In addition, packet communications of all applications are not required to have low delay (for example, delay less than predetermined time t1), and there is packet communication that does not necessarily require a real time property. In this case, base station 200 can efficiently classify packets and provide communication of quality according to the communication request of each packet.

In a case where wireless backhaul line 20 is congested and the radio resources are insufficient, base station 200 lowers the priority of radio resource allocation for the packet B, and increases the priority of radio resource allocation for the packet A. Thus, base station 200 can preferentially start communication of the packet A, and the possibility of ensuring the quality of service (QoS) of packet A is increased.

In TCP communication, since retransmission control is performed, communication delay due to retransmission may occur. By performing FEC coding, base station 200 can reduce communication errors in wireless backhaul line 20, reduce communication delay due to TCP retransmission control, and improve the frequency utilization efficiency of entire wireless communication system 10.

Base station 200 can improve the tolerance to noise by performing beamforming using the MIMO antenna, and as a result, the transmission distance can be extended. Thus, base station 200 performs beamforming so as to be able to improve the communication quality.

In this manner, base station 200 can achieve both reduction in deterioration of communication quality and reduction in communication delay time in wireless backhaul line 20.

Other Exemplary Embodiments

As described above, the first exemplary embodiment has been described as an example of the technique of the present disclosure. However, the technique of the present disclosure is not limited to this, and can also be applied to exemplary embodiments in which change, substitution, addition, omission, or the like is performed.

In the first exemplary embodiment, macrocell base station 200A and small cell base station 200B connected over wireless backhaul line 20 are illustrated. Macrocell base station 200A is an example of a centralized base station. Small cell base station 200B is an example of a forward base station. The centralized base station may be a gateway (GW) device. The forward base station may be an access point (AP) device. The first exemplary embodiment can be applied to all communication devices communicating over wireless backhaul line 20 in the heterogeneous network.

The first exemplary embodiment can be applied to all communication devices communicating over wireless lines (for example, a point to point (P2P) line in the heterogeneous network).

For example, the first exemplary embodiment may be applied to a surveillance system in which a surveillance camera and a monitoring center device (for example, a disaster prevention center device) are connected through a wireless line. In this case, the packet A includes, for example, abnormality detection data. The surveillance camera captures an image, extracts features of the image, and detects the presence or absence of an abnormality from the extracted features. The abnormality detection data is data indicating that an abnormality is detected from the image. The packet B includes, for example, image data for which an abnormality has not been detected.

Thus, the monitoring center device can quickly detect an abnormal situation around the surveillance camera, and can issue an instruction of the dispatch to the surroundings of the surveillance camera or an instruction to start image transmission to the surveillance camera. Therefore, the surveillance camera and the monitoring center device can cooperate with each other to suppress the occurrence of illegal acts and crimes.

The first exemplary embodiment may be applied to a transaction processing system in which an automated teller machine (ATM) of a bank and a processing center server of a bank are connected through a wireless line. In this case, examples of the packet A include settlement input information and settlement confirmation information. The settlement input information is input information related to settlement to ATM, and includes, for example, user identification information, payment destination information, and payment amount information. The settlement confirmation information includes the result of checking data related to settlement. Examples of the packet B include information on passbook entry.

For example, ATM includes payment information in the packet A, and transmits it to the processing center server. The processing center server checks the database retained by the processing center server to determine whether or not the settlement by the user is fraudulent settlement based on the settlement information included in the packet A. The processing center server includes payment confirmation information including whether or not it is fraudulent settlement in the packet A, and transmits it to the ATM. The ATM stops the settlement process in a case where the settlement confirmation information includes information on fraudulent settlement.

Thus, the ATM and the processing center server can cooperate with each other to suppress the occurrence of fraudulent settlement using the ATM, and suppress unauthorized use of credit cards and cash cards.

The first exemplary embodiment may be applied to an automatic driving system in which a vehicle and a traffic light are connected through a wireless line. The vehicle has an automatic driving function. The traffic light has an automatic driving support function. In this case, the packet A includes, for example, deceleration information (brake information) and deceleration notification information of a vehicle. The deceleration information includes, for example, vehicle identification information, vehicle position information, and vehicle speed information.

For example, when the driver of the vehicle decelerates the vehicle, the vehicle detects deceleration and transmits deceleration information to the traffic light. Upon receiving the deceleration information of the vehicle, the traffic light transmits deceleration notification information for making a notification of the existence of the decelerated vehicle to the vehicle traveling around the decelerated vehicle. The vehicle that has received the deceleration notification information controls the traveling of the vehicle, based on the deceleration notification information.

Thus, the vehicle and the traffic light can cooperate with each other to detect the driving state of the vehicle and suppress occurrence of a traffic accident.

The first exemplary embodiment may be applied to a digital signage system in which a digital signage and a content distribution center apparatus are connected through a wireless line.

In the first exemplary embodiment, it is exemplified that terminal 400 is a terminal as a communication partner, but terminal 400 may be a server as a communication partner.

In the first exemplary embodiment, it is exemplified that first packet classification unit 208 and second packet classification unit 228 classify packets into two types according to whether the allowable delay time of the packet is longer than a predetermined time or shorter than the predetermined time. Further, first packet classification unit 208 and second packet classification unit 228 may classify packets into three types or more.

In the first exemplary embodiment, a multi-level modulation scheme, an MIMO transmission scheme, an FEC coding scheme, and an automatic retransmission request scheme are exemplified as a wireless transmission scheme. As a wireless transmission scheme, other parameters related to communication delay time and communication quality may be included.

In the first exemplary embodiment, first transmitting antenna 204 and second transmitting antenna 224 are exemplified as an antenna for MIMO, but they are not limited to the antenna for MIMO.

In the first exemplary embodiment, processor 250 (250A, 250B) may be physically configured in any way. However, if a programmable processor is used, since processing contents can be changed by changing programs, the degree of freedom in designing processor 250 can be increased. Processor 250 may be configured with one semiconductor chip or physically a plurality of semiconductor chips. In the case where processor 250 is configured with a plurality of semiconductor chips, each control in the first exemplary embodiment may be realized by separate semiconductor chips. In this case, one processor 250 may be configured with the plurality of semiconductor chips. In addition, the processor 250 may be formed of a member (such as a capacitor) having a function different from that of the semiconductor chip. Further, one semiconductor chip may be configured so as to realize the functions of processor 250 and other functions.

In the first exemplary embodiment, FIG. 2 and FIG. 3 illustrate the configurations of macrocell base station 200A and small cell base station 200B. In FIG. 2 and FIG. 3, the configuration of each block may be realized by hardware, or may be realized by software.

(Outline of Exemplary Embodiment of Present Disclosure)

As described above, base station 200 according to the above exemplary embodiment communicates with another base station 200 over wireless backhaul line 20 on which a plurality of wireless communication modes are mixed and used. Base station 200 includes processor 250 and an antenna. In accordance with the allowable delay time of the data, processor 250 determines whether or not to add redundant data to the data. In accordance with the result of the determination, the antenna transmits data by adding or not adding redundant data to data.

Base station 200 is an example of a wireless communication apparatus. The antennas are, for example, first transmitting antenna 204 and second transmitting antenna 224.

Thus, base station 200 can improve communication quality and reduce a communication time delay in a case of communicating data over a backhaul line, in consideration of the allowable delay time of the data.

Processor 250 may classify the data into first data in which the allowable delay time of data is shorter than a predetermined time, and second data in which the allowable delay time of data is longer than the predetermined time. Antenna may transmit first data without adding redundant data and transmit second data by adding redundant data. The first data is, for example, packet A. The second data is, for example, packet B.

Thus, in a case where the allowable delay time is relatively long, base station 200 performs, for example, error correction coding (for example, FEC coding), thereby suppressing deterioration of communication quality and an increase in BER and PER. As the communication quality of data increases, base station 200 can shorten the time required for TCP retransmission. On the other hand, in a case where the allowable delay time is relatively short, base station 200 does not perform error correction coding, such that the time required for error correction coding can be omitted, and the possibility of data communication by satisfying allowable delay time can be increased.

In a case where the volume of data is equal to or larger than the line capacity of wireless backhaul line 20, processor 250 may allocate radio resources to the first data in preference to the second data.

Thus, base station 200 can allocate radio resources in consideration of the congestion situation of wireless backhaul line 20. Base station 200 can preferentially start communication of data requiring real-time property, and can shorten the communication delay time.

In a case where the amount of the data is equal to or larger than the line capacity of wireless backhaul line 20, processor 250 may allocate radio resources for the second data within a range where the amount of sum of the first data and the second data is equal to or smaller than the line capacity.

Thus, base station 200 can satisfy the allowable delay time of data requiring real time property, and can also transmit data that does not require real time property as quickly as possible.

The wireless communication method of the above exemplary embodiment is a wireless communication method in base station 200 that communicates with another base station 200 over wireless backhaul line 20 on which a plurality of wireless communication schemes are mixed and used. In this method, it is determined whether or not to add redundant data to the data, depending on the allowable delay time of data. In accordance with the determination result, data is transmitted by adding or not adding redundant data to the data.

Thus, base station 200 can improve communication quality and reduce a communication time delay in a case of communicating data over a backhaul line, in consideration of the allowable delay time of the data.

INDUSTRIAL APPLICABILITY

The present disclosure is useful for a wireless communication apparatus and a wireless communication method capable of improving the communication quality and reducing the communication delay time in a case of communicating data through a backhaul line.

REFERENCE MARKS IN THE DRAWINGS

10 WIRELESS COMMUNICATION SYSTEM
20 WIRELESS BACKHAUL LINE
21 UPLINK
22 DOWNLINK
100 TERMINAL
200 BASE STATION
200A MACROCELL BASE STATION
200B SMALL CELL BASE STATION
201 COMMUNICATION INTERFACE
202 FIRST TRANSMISSION PROCESSING UNIT
203 FIRST WIRELESS TRANSMISSION UNIT
204 FIRST TRANSMITTING ANTENNA
205 FIRST RECEIVING ANTENNA
206 FIRST WIRELESS RECEPTION UNIT
207 FIRST RECEPTION PROCESSING UNIT
208 FIRST PACKET CLASSIFICATION UNIT
222 SECOND TRANSMISSION PROCESSING UNIT
223 SECOND WIRELESS TRANSMISSION UNIT
224 SECOND TRANSMITTING ANTENNA
225 SECOND RECEIVING ANTENNA
226 SECOND WIRELESS RECEPTION UNIT
227 SECOND RECEPTION PROCESSING UNIT
228 SECOND PACKET CLASSIFICATION UNIT
229 THIRD WIRELESS TRANSMISSION UNIT
230 THIRD TRANSMITTING ANTENNA
231 THIRD RECEIVING ANTENNA
232 THIRD WIRELESS RECEPTION UNIT
233 THIRD PACKET DECODING UNIT
250, 250A, 250B PROCESSOR
260, 260A, 260B MEMORY
300 CORE NETWORK
400 TERMINAL

The invention claimed is:

1. A wireless communication apparatus which communicates with another wireless communication apparatus over a wireless backhaul line in which a plurality of wireless communication schemes are mixed and used, the wireless communication apparatus comprising:

a processor, and

MIMO (Multiple-Input and Multiple-Output) antennas coupled to the processor, wherein the processor, in operation, classifies data into first data in which allowable delay time is equal to or shorter than a predetermined time, and a second data in which the allowable delay time is longer than the predetermined time, determines, with respect to the second data, whether or not a required number of packets for FEC (Forward Error Correction) coding is acquired, in response to determining that the required number of packets for FEC coding is acquired for the second data, adds FEC redundant data to the second data to thereby reduce a retransmission rate of the second data, and determines not to add FEC redundant data to the first data; and allocates the first data and the second data to MIMO antennas according to a defined MIMO transmission scheme; and wherein the MIMO antennas, in operation, transmit the first data, to which FEC redundant data is not added, and the second data, to which FEC redundant data is added.

2. The wireless communication apparatus of claim 1, wherein the processor, in response to determining that an amount of the data is equal to or larger than a line capacity of the wireless backhaul line, allocates radio resources to the first data in preference to the second data.

3. The wireless communication apparatus of claim 2, wherein the processor, in response to determining that the amount of the data is equal to or larger than a line capacity of the wireless backhaul line, allocates radio resources to the second data within a capping range, in which a sum amount of the first data and the second data does not exceed the line capacity.

4. The wireless communication apparatus of claim 1, wherein the first data to which FEC redundant data is not added includes abnormality detection data indicative of detection of an abnormality in an image taken by a surveillance camera coupled to a monitoring center apparatus in a surveillance system, and the second data to which FEC redundant data is added includes image data in which no abnormality is detected in the surveillance system.

5. The wireless communication apparatus of claim 1, wherein the first data to which FEC redundant data is not added includes settlement input information and settlement confirmation information in a transaction processing system in which an automated teller machine and a central server are coupled, and the second data to which FEC redundant data is added includes book entry to record the settlement in the transaction processing system.

6. The wireless communication apparatus of claim 1, wherein the MIMO transmission scheme is defined by at least one of: a number of MIMO transmission streams allocated to the MIMO antennas, transmission powers of the MIMO antennas, and beamforming based on the MIMO antennas.

7. A wireless communication method of a wireless communication apparatus which communicates with another wireless communication apparatus over a wireless backhaul line in which a plurality of wireless communication schemes are mixed and used, the method comprising classifying data into first data in which allowable delay time is equal to or shorter than a predetermined time, and a second data in which the allowable delay time is longer than the predetermined time, determining, with respect to the second data, whether or not a required number of packets for FEC (Forward Error Correction) coding is acquired, in response to determining that the required number of packets for FEC coding is acquired for the second data, adding FEC redundant data to the second data to thereby reduce a retransmission rate of the second data, and determining not to add FEC redundant data to the first data, allocating the first data and the second data to MIMO (Multiple-Input and Multiple-Output) antennas according to a defined MIMO transmission scheme, and transmitting, via the MIMO antennas, the first data, to which FEC redundant data is not added, and the second data, to which FEC redundant data is added.

8. The wireless communication method of claim 7, comprising:

in response to determining that an amount of the data is equal to or larger than a line capacity of the wireless backhaul line, allocating radio resources to the first data in preference to the second data.

9. The wireless communication method of claim 8, comprising:

in response to determining that the amount of the data is equal to or larger than a line capacity of the wireless backhaul line, allocating radio resources to the second data within a capping range, in which a sum amount of the first data and the second data does not exceed the line capacity.

10. The wireless communication method of claim 7, wherein the first data to which FEC redundant data is not added includes abnormality detection data indicative of detection of an abnormality in an image taken by a surveillance camera coupled to a monitoring center apparatus in a surveillance system, and the second data to which FEC redundant data is added includes image data in which no abnormality is detected in the surveillance system.

11. The wireless communication method of claim 7, wherein the first data to which FEC redundant data is not added includes settlement input information and settlement confirmation information in a transaction processing system in which an automated teller machine and a central server are coupled, and the second data to which FEC redundant data is added includes book entry to record the settlement in the transaction processing system.

12. The wireless communication method of claim 7, wherein the MIMO transmission scheme is defined by at least one of: a number of MIMO transmission streams allocated to the MIMO antennas, transmission powers of the MIMO antennas, and beamforming based on the MIMO antennas.

* * * * *